United States Patent
Akram et al.

[11] Patent Number: 5,834,945
[45] Date of Patent: Nov. 10, 1998

[54] HIGH SPEED TEMPORARY PACKAGE AND INTERCONNECT FOR TESTING SEMICONDUCTOR DICE AND METHOD OF FABRICATION

[75] Inventors: Salman Akram; Alan G. Wood, both of Boise; Warren M. Farnworth, Nampa, all of Id.

[73] Assignee: Micron Technology, Inc., Boise, Id.

[21] Appl. No.: 777,822

[22] Filed: Dec. 31, 1996

[51] Int. Cl.[6] .................................................. G01R 31/02
[52] U.S. Cl. ........................................ 324/755; 324/765
[58] Field of Search ................................ 324/755, 701, 324/765, 158.1, 754

[56] References Cited

U.S. PATENT DOCUMENTS

| | | | |
|---|---|---|---|
| 4,994,735 | 2/1991 | Leedy | 324/158 F |
| 5,006,792 | 4/1991 | Malhi et al. | 324/158 F |
| 5,073,117 | 12/1991 | Malhi et al. | 439/71 |
| 5,088,190 | 2/1992 | Malhi et al. | 29/843 |
| 5,123,850 | 6/1992 | Elder et al. | 439/67 |
| 5,135,889 | 8/1992 | Allen | 437/195 |
| 5,177,439 | 1/1993 | Liu et al. | 324/755 X |
| 5,302,891 | 4/1994 | Wood et al. | 324/158 F |
| 5,330,919 | 7/1994 | Westbrook et al. | 324/765 X |
| 5,451,165 | 9/1995 | Cearley-Cabbiness et al. | 439/71 |
| 5,483,174 | 1/1996 | Hembree et al. | 324/765 |
| 5,483,741 | 1/1996 | Akram et al. | 29/846 |
| 5,495,179 | 2/1996 | Wood et al. | 324/755 |
| 5,519,332 | 5/1996 | Wood et al. | 324/755 |
| 5,530,376 | 6/1996 | Lim et al. | 324/765 |
| 5,539,321 | 7/1996 | Sciacero et al. | 324/628 |
| 5,541,525 | 7/1996 | Wood et al. | 324/755 |
| 5,543,725 | 8/1996 | Lim et al. | 324/755 |
| 5,559,444 | 9/1996 | Farnworth et al. | 324/754 |
| 5,578,934 | 11/1996 | Wood et al. | 324/758 |
| 5,634,267 | 6/1997 | Farnworth et al. | 324/765 |
| 5,639,385 | 6/1997 | McCormick et al. | 324/765 X |
| 5,644,247 | 7/1997 | Hyun et al. | 324/755 |

FOREIGN PATENT DOCUMENTS

| | | | |
|---|---|---|---|
| 5-218153 | 8/1993 | Japan | H01L 21/68 |

*Primary Examiner*—Michael Brock
*Attorney, Agent, or Firm*—Stephen A. Gratton

[57] ABSTRACT

An improved interconnect for semiconductor dice, a method for testing dice using the interconnect, and a method for fabricating the interconnect are provided. The interconnect includes dense arrays of contact members configured to establish temporary electrical communication with contact locations on a die under test. In addition, the interconnect includes patterns of multi level conductors formed on different levels of the substrate and separated by insulating layers. The multi level conductors can be formed with a higher density and with less cross talk than planar conductors to permit high speed testing of dice having a large number of bond pads. The interconnect can be configured for use with a temporary package for housing a single die for burn-in or other testing. Electrical paths between terminal contacts on the package and the multi level conductors on the interconnect can be formed by microbump tape having low resistance microbumps bonded to the multi level conductors.

29 Claims, 5 Drawing Sheets

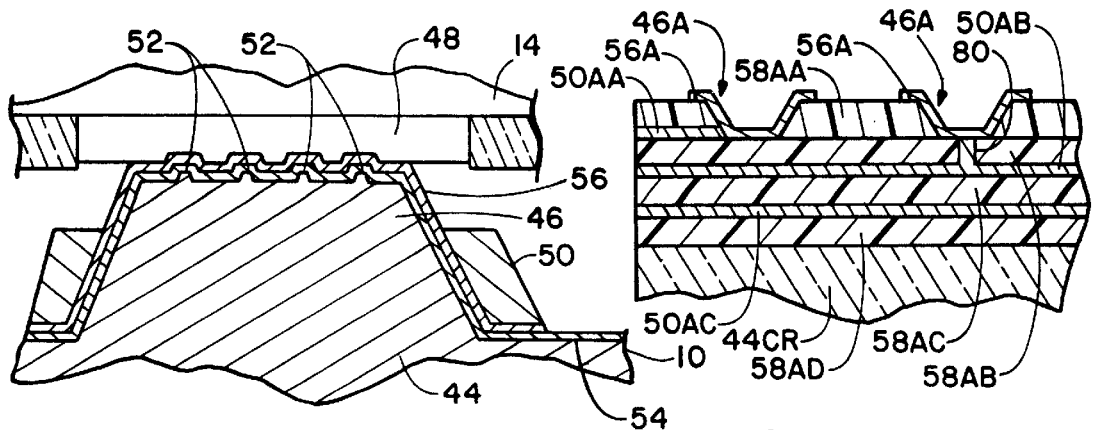
FIGURE 7
FIGURE 8A
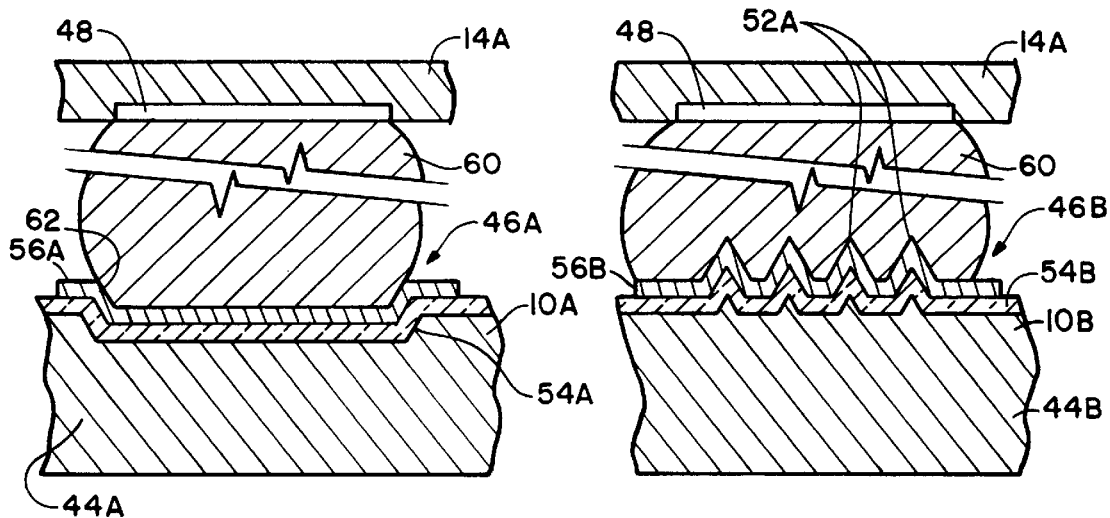
FIGURE 7A
FIGURE 7B
FIGURE 7C
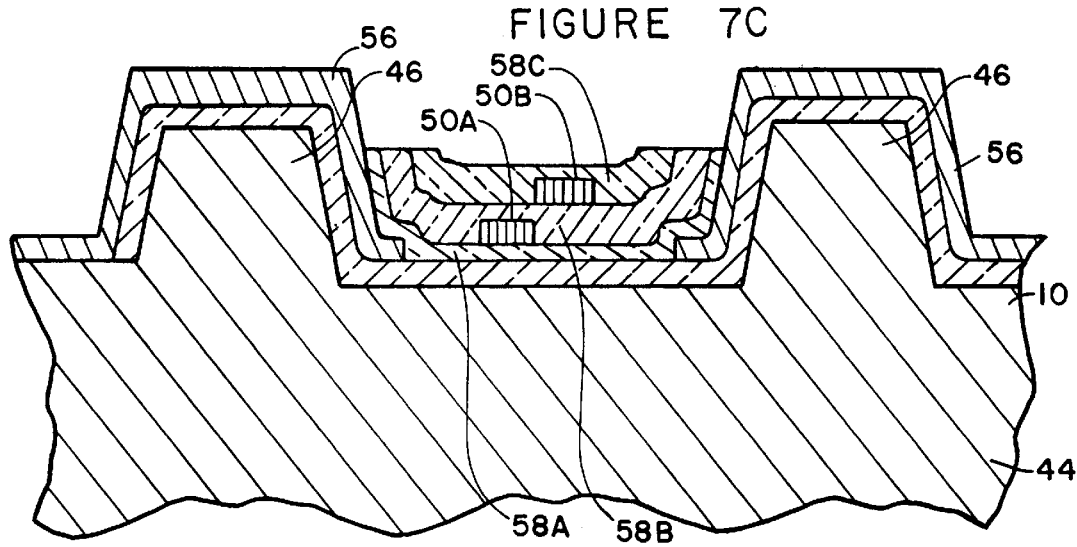
FIGURE 8

HIGH SPEED TEMPORARY PACKAGE AND INTERCONNECT FOR TESTING SEMICONDUCTOR DICE AND METHOD OF FABRICATION

FIELD OF THE INVENTION

This invention relates generally to semiconductor manufacture and more particularly to a high speed temporary package and interconnect for testing semiconductor dice, to a method for testing dice using the interconnect, and to a method for fabricating the interconnect.

BACKGROUND OF THE INVENTION

Semiconductor dice must be tested during the manufacturing process to evaluate various electrical parameters of the integrated circuits formed on the dice. Accordingly, different testing procedures have been developed by semiconductor manufacturers for testing semiconductor dice. Standard tests for gross functionality are typically performed by probe testing the dice at the wafer level using probe cards and wafer steppers. Burn-in testing is typically performed after the dice have been singulated and packaged using a burn-in oven or similar testing apparatus in electrical communication with test circuitry. Among the tests performed are dynamic burn-in, input/output leakage, speed verification, opens, shorts, refresh and a range of algorithms to verify AC parameters.

In the case of unpackaged dice, marketed by manufacturers as known good dice (KGD), temporary packages are required to house a single bare die for burn-in and other test procedures. This type of temporary package is described in U.S. Pat. Nos. 5,541,525, 5,519,332 and 5,495,179 to Wood et al.

These temporary packages typically include an interconnect component for establishing temporary electrical communication with the die. The interconnect can include a substrate with contact members for electrically contacting the bond pads or other contact locations on the die. The interconnect can also include conductors, such as metallized traces, for providing a conductive path from testing circuitry to the contact members. Interconnects for temporary packages are disclosed in U.S. Pat. Nos. 5,483,741 and 5,523,697 to Farnworth et al., incorporated herein by reference.

With advances in the architecture of semiconductor devices, it is advantageous to perform some testing of integrated circuits using very high speed testing signals. For example, testing frequencies of 500 MHz and greater are anticipated for some memory products such as DRAMS. The temporary packages and interconnects used to test dice must be capable of transmitting signals at these high speeds without generating parasitic inductance and cross coupling (i.e., "cross talk").

Parasitic inductance and cross coupling can arise in various electrical components of the temporary packages and in the electrical interface of the interconnect with the temporary package. This can adversely effect the test procedure by causing the power supply voltage to drop or modulate during the test procedure and by causing noise and spurious signals.

For example, the conductors on the interconnect are typically wire bonded to corresponding conductive traces and terminal contacts formed on the temporary package. Capacitive coupling can occur between adjacent conductors on the interconnect and between adjacent bond wires to the conductors. High speed switching of the voltage levels in the conductors and bond wires can result in corresponding inadvertent changes in the voltage levels on nearby conductors, or bond wires, resulting in logic errors.

The problems of parasitic inductance and cross coupling can be compounded by the large number of bond pads contained on later generations of semiconductor dice. A large number of bond pads requires a corresponding large number of contact members and conductors on the interconnect. Because of their high density, it can be difficult to locate and construct the contact members and conductors without forming parasitic inductors and initiating cross talk and interconductor noise.

Because of these and other problems, there is a need in the art for improved temporary packages and interconnects for testing semiconductor dice and improved high speed testing methods.

SUMMARY OF THE INVENTION

In accordance with the invention, an improved temporary package and interconnect for testing semiconductor dice are provided. The temporary package comprises a base for retaining a single bare die and a force applying member for biasing the die against the interconnect. The interconnect mounts to the base and includes dense arrays of contact members and multi level conductors in electrical communication with the contact members. Insulating layers can be formed between adjacent levels of conductors to prevent cross talk and capacitive coupling between the conductors. Additionally, if desired, the conductors can be embedded in separate insulating layers to provide electrical isolation in both horizontal and vertical directions.

An electrical path between the contact members on the interconnect and terminal contacts on the package base can be formed by microbump tape similar to multi layered TAB tape. The microbump tape can include patterns of metal traces with microbumps (metal balls) formed in vias through the tape and electrically connected to the traces. The conductors on the interconnect can be formed with connections pads having a metallurgy for bonding to the microbumps. The microbumps can be formed of a solder alloy to provide a low resistance electrical path to the conductors that permits high speed testing.

A system for testing the die includes the interconnect, the temporary package, the microbump tape, and a testing apparatus such as a burn in board, for retaining the temporary package in electrical communication with test circuitry.

The multi level construction of the interconnect helps to overcome space limitations and permits a large number of input/output paths to be formed for a dense array of contact members. This allows testing of dice having a large number of bond pads and allows test procedures with a large number of separate input/output paths. In addition, conductors and insulating stacks on the interconnect can be used to form micro strip, embedded micro strip, and strip line conductor configurations and to tailor the electrical properties of the interconnect for high speed testing with lower noise. Furthermore, with this type of multi layered construction, impedance can be controlled and the conductors can be formed with dense peripheral arrays of connection pads.

For fabricating the interconnect, the contact members can be formed as raised members by etching a substrate and then covering the raised members with a conductive layer formed of a metal (e.g., aluminum) or a metal silicide (e.g., $TiSi_2$). The contact members can also include penetrating projections for penetrating contact locations on the dice to a limited penetration depth. Alternately the contact members can be formed as indentations covered with a conductive layer and configured to electrically connect to bumped contact locations (e.g., solder bumps). The multi level conductors can be formed on the substrate using a metallization process in which patterned metal layers are alternated with insulating layers.

BRIEF DESCRIPTION OF THE DRAWINGS

FIG. 7 is an enlarged cross sectional view taken along section line 7—7 of FIG. 6 illustrating the electrical connection between a contact member on the interconnect and a flat contact location on the die;

FIG. 7A is an enlarged cross sectional view taken along section line 7A—7A of FIG. 6A illustrating the electrical connection between an alternate embodiment indentation contact member and a bumped contact location on a bumped die;

FIG. 7B is an enlarged cross sectional view equivalent to FIG. 7A of an alternate embodiment contact member for bumped dice;

FIG. 7C is an enlarged cross sectional view equivalent to FIG. 7A of an alternate embodiment indentation contact member for bumped dice;

FIG. 8 is an enlarged cross sectional view taken along section line 8—8 of FIG. 5 illustrating multi level conductors on the interconnect in electrical communication with selected contact members;

FIG. 8A is an enlarged cross sectional view equivalent to FIG. 8 but illustrating multi level conductors on an interconnect having indentation contact members;

DETAILED DESCRIPTION OF THE PREFERRED EMBODIMENT

Figure 1:
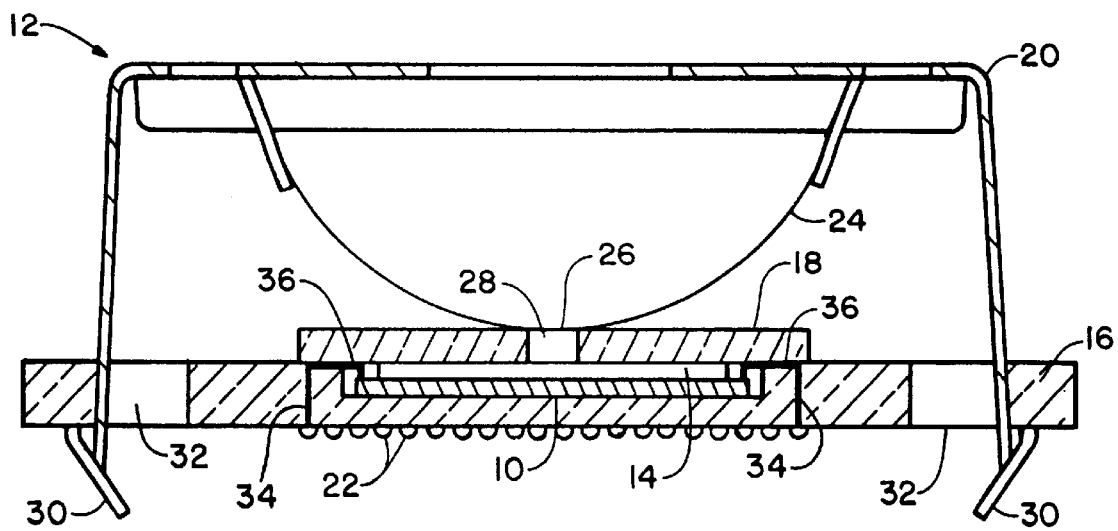
FIG. 1 is a cross sectional view of a temporary package and interconnect constructed in accordance with the invention for testing semiconductor dice.

Referring to FIG. 1, an interconnect 10 and temporary package 12 constructed in accordance with the invention are shown assembled with a semiconductor die 14. The interconnect 10 and temporary package 12 form a system for testing the die 14.

Figure 2:
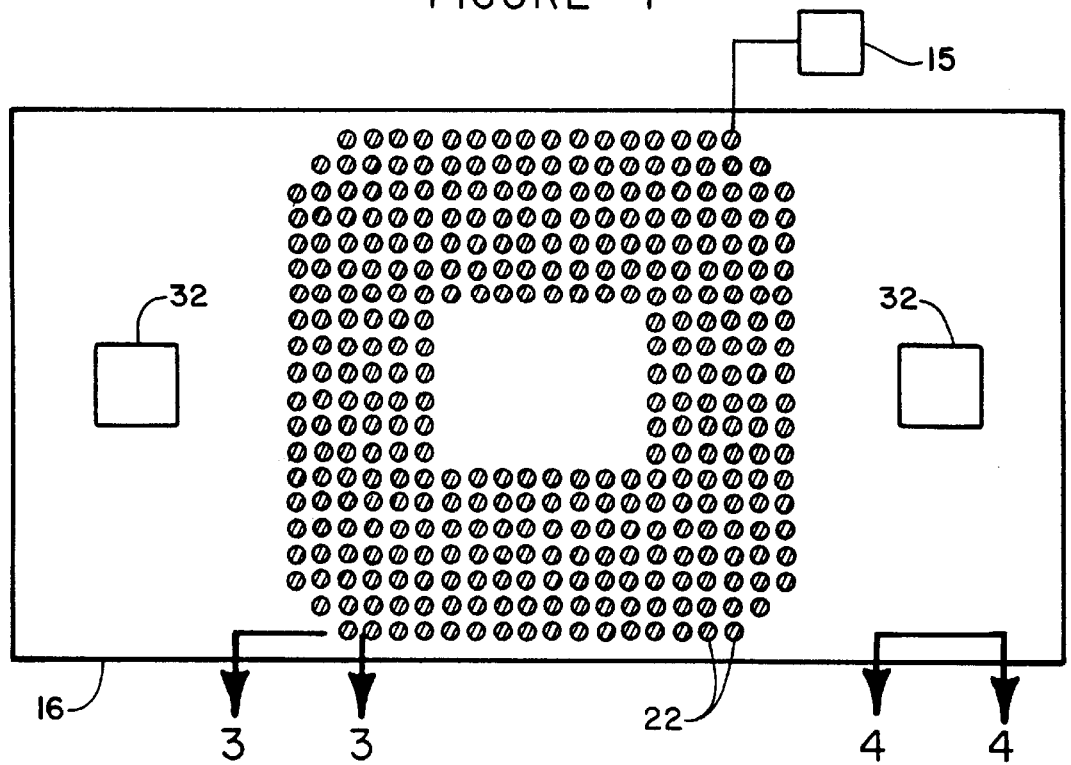
FIG. 2 is a bottom view of the temporary package shown in FIG. 1 illustrating terminal contacts formed on the package in a dense grid array.

The interconnect 10 can be removably mounted to a base 16 of the temporary package 12 and is configured to establish temporary electrical communication between the die 14 and terminal contacts 22 formed on the base 16. For testing the die 14, the terminal contacts 22 on the temporary package 12 can be placed in electrical communication with test circuitry 15 (FIG. 2). Following the test procedure, the die 14 can be removed from the package 12 and used as a known good die (KGD).

The semiconductor die 14 can be a bare die or a chip scale package. A bare die does not include a conventional plastic or ceramic package but can include flat or bumped bond pads. Chip scale packages typically include thin protective coatings formed of glass or other materials bonded to the face and backside of a bare die.

In addition to the base 16, the temporary package 12 includes a force applying mechanism 20. The force applying mechanism 20 secures the die 14 to the base 16 and presses the die 14 against the interconnect 10. The force applying mechanism 20 can include a pressure plate 18 and a spring 24. Openings 26, 28 in the spring 24 and pressure plate 18 allow the die 14 to be held by a vacuum tool during alignment and assembly of the package 12. Clips 30 can be formed on the force applying mechanism 20 and removably attach to corresponding openings 32 formed in the base 16.

Still referring to FIG. 1, the package base 16 can include patterns of conductive traces 34 in electrical communication with the terminal contacts 22. As will be further explained, electrical paths can be formed between the interconnect 10 and the conductive traces 34. In the illustrative embodiment the electrical paths are formed by microbump tape 36 (FIG. 6) bonded to the interconnect 10 and to the conductive traces 34 on the package base 16. Alternately the electrical paths can include wire bonds, or mechanical-electrical connectors such as clips or slide contacts.

Figure 3:
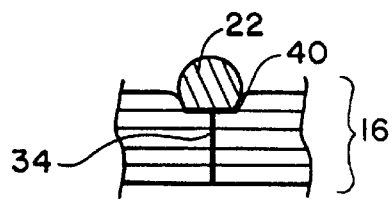
FIG. 3 is a cross sectional view of the temporary package taken along section line 3—3 of FIG. 2 illustrating a terminal contact on the package.
Figure 4:
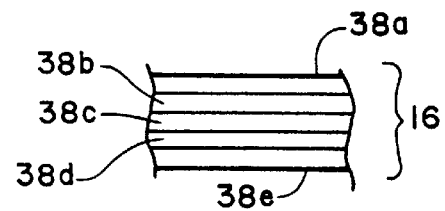
FIG. 4 is a cross sectional view of the temporary package taken along section line 4—4 of FIG. 2 illustrating the laminated construction of the package.

As shown in FIGS. 3 and 4, the package base 16 can be formed of laminated ceramic layers 38a–38e. U.S. Pat. No. 5,519,332, incorporated herein by reference, describes a method for forming this type of package base 14. Briefly, this process involves forming metallized circuits in the x, y and z planes. These circuits are formed on green sheets of ceramic using a suitable metallization process and are interconnected with metal filled vias. The green sheets are then pressed together and sintered at high temperatures to form a unitary structure. Using this process the conductive traces 34 can be formed of suitable metals and interconnected to the terminal contacts 22.

The package base 16 can also be formed using a 3-D injection molding process out of a high temperature glass filled plastic or out of a glass filled resin laminate such as FR-4 board. Such a process is described in the previously cited U.S. Pat. No. 5,519,332. The package base 16 can also be formed using a Cerdip process in which a lead frame containing the conductive traces 34 or other electrical members is molded or laminated to a plastic or ceramic base material.

The conductive traces 34 on the package base 16 can also include land pads 40 (FIG. 3) wherein the terminal contacts 22 are formed. In FIG. 3 the land pads 40 are shown recessed into the package base 16. However, the land pads 40 can also be formed directly on an exterior surface of the package base 16. The land pads 40 can be formed out of a suitable metal or stack of metals. Exemplary metals can include gold, copper, silver, tungsten, tantalum, platinum, palladium and molybdenum or alloys of these metals. An exemplary stack can include a gold layer with nickel underplating. Other exemplary stacks can include other combinations of the above metals. A metallization process such as plating can be used to form the land pads 40. Such a plating process can include electrolytic or electroless deposition of a metal layer followed by resist coating, exposure, development, and selective wet chemical etching, if required.

The terminal contacts 22 can be formed on the land pads 40 as metal balls arranged in a dense grid pattern such as a ball grid array (BGA). The terminal contacts 22 can be configured for contact with a mating electrical connector such as a socket of a burn-in board in electrical communication with the test circuitry 15 (FIG. 2). One method for forming the terminal contacts 22 is by stencil printing a solder paste onto the land pads 34 followed by reflow into a spherical shape. U.S. patent application Ser. No. 08/584,628, now abandoned, incorporated herein by reference, discloses a method for forming a temporary package with land pads 40 and terminal contacts 22.

Figure 5:
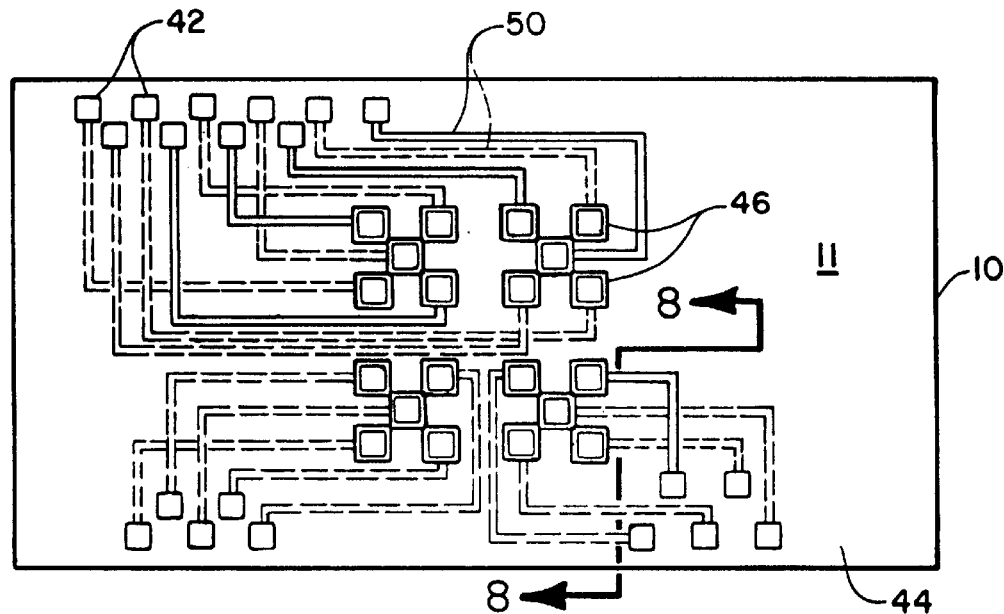
FIG. 5 is a schematic plan view of an interconnect constructed in accordance with the invention.

Referring to FIG. 5, the interconnect 10 is shown in greater detail. The interconnect 10 includes a substrate 44 formed of an etchable material such as silicon, germanium, silicon-on-glass or silicon-on-sapphire. The substrate 44 can also be formed of ceramic. In addition, the substrate 44 can be formed of a photosensitive glass, or glass-ceramic material, such as "FOTOFORM" manufactured by Corning.

The interconnect 10 includes arrays of contact members 46 configured to contact bond pads 48 (FIG. 6) or other contact locations on the die 14. The contact members 46 project from an active surface 11 of the interconnect 10. The active surface 11 can also be referred to as the "face" or "circuit side" of the interconnect 10.

In addition, the interconnect 10 includes patterns of multi level conductors 50 formed on or subjacent to the active surface 11 of the interconnect 10. As used herein, the term "multi level conductors" means that the conductors 50 are not co-planar to one another but are on different levels, layers or planes of the interconnect 10. Typically these different levels, layers or planes, are parallel to one another and to the major plane of the active surface 11 of the interconnect 10.

The multi level conductors 50 are formed in electrical communication with the contact members 46. The multi level conductors 50 are configured to provide a desired pattern of conductive paths on the interconnect 10 to and from the contact members 46.

The multi level conductors 50 can also include connection pads 42. The connection pads 42 can be formed in a dense peripheral array along the outer peripheral edges of the interconnect 10. Preferably the connection pads 42 are formed with a solderable metallurgy that permits solder microbumps 37 (FIG. 6) to be easily bonded thereto. The connection pads 42 can be formed by thick or thin film deposition processes. Suitable metals for the connection pads include wettable thick film conductors, plated Au, plated Ni, thin film copper, and multi layer thin films. The connection pads 42 can also be formed of a same metal as the multi level conductors 50 using the same or a different metallization process.

Figure 6:
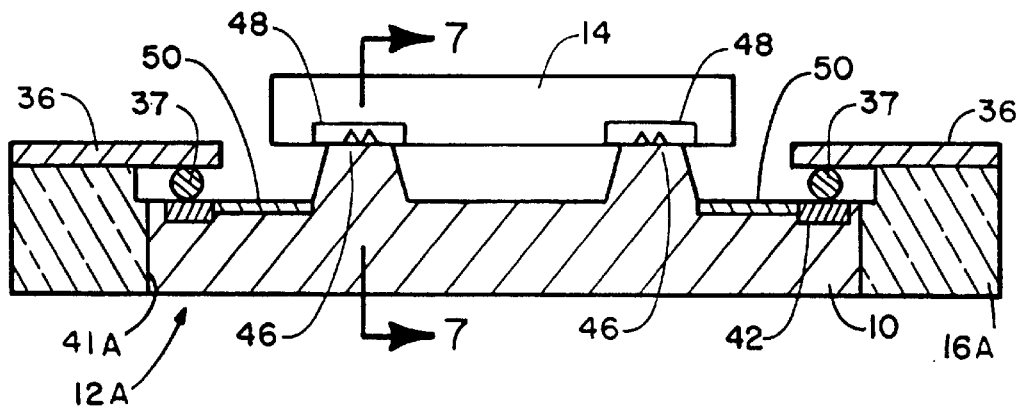
FIG. 6 is a schematic cross sectional view illustrating the interconnect during testing of a semiconductor die and the electrical path between the interconnect and the temporary package.

Referring to FIG. 6, the electrical interconnection between the conductors 50 on the interconnect 10 and a package base 16A for a temporary package 12A is illustrated. In this embodiment the package base 16A includes an opening 41 formed therethrough. The opening 41A provides access for inserting the interconnect 10 into the package base 16A and for forming the electrical paths between the interconnect 10 and package base 16A.

The electrical paths between the interconnect 10 and package base 16A can include microbump tape 36 formed as multi layered TAB tape. The microbump tape 36 can include a flexible film, such as polyimide, onto which patterns of metal traces (not shown) and microbumps 37 are formed. The metal traces can be formed on one side of the film and the microbumps 37 can be formed in metal filled vias formed through the film in electrical communication with the traces. The microbump tape 36 can be a commercially available product such as "ASMAT" manufactured by Nitto Denko. U.S. Pat. No. 5,072,289 to Sugimoto et al., incorporated herein by reference, describes a method for forming microbump tape.

The microbumps 37 on the microbump tape 36 electrically connect to the connection pads 42 for the conductors 50 on the interconnect 10. The electrical connections between the microbumps 37 and the connection pads 42 can be bonded connections formed by thermal or thermal-sonic bonding. This type of connection provides a low resistance path and permits high speed testing to be performed with a minimal amount of parasitic resistance and inductor formation. To facilitate the bonding process, the microbumps 37 can be formed of a solder alloy or of a metal such as Ni, Au or Cu. Alternately the connection between the microbumps 37 and connection pads 42 can be non bonded wherein there is contact but no bonding.

The microbump tape 36 can also include microbumps (not shown) that electrically connect to the conductive traces 34 (FIG. 1) on the package base 16. This is preferably a bonded connection but can also be a non bonded connection. This completes the electrical path from the terminal contacts 22 (FIG. 1) on the package base 16 to the contact members 46 (FIG. 6) on the interconnect 10.

Figure 6A:
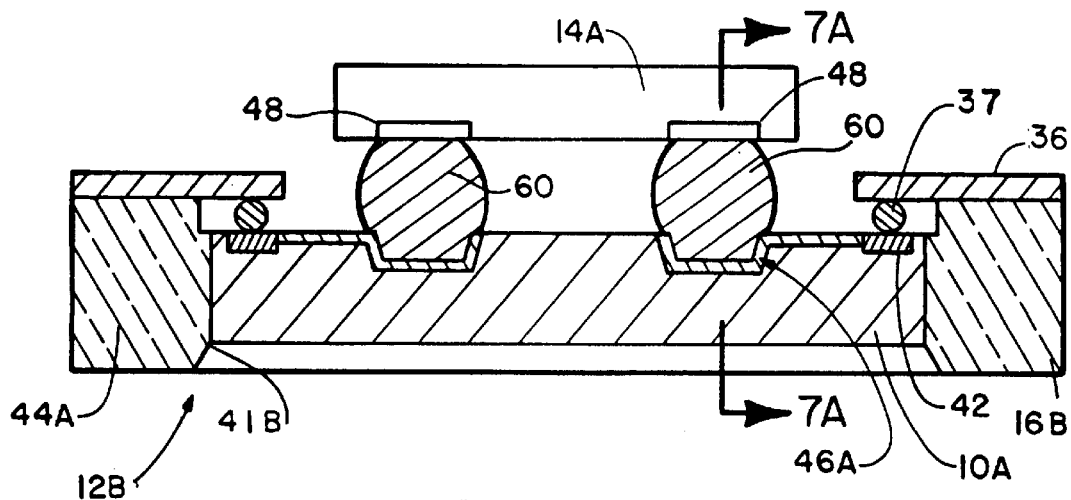
FIG. 6A is a schematic cross sectional view equivalent to FIG. 6 illustrating an alternate embodiment interconnect for testing bumped semiconductor dice.

Referring to FIG. 6A, an alternate embodiment interconnect 10A and package base 16B form a temporary package 12B for testing a bumped die 14A. The bumped die 14A includes metal bumps 60 formed on the bond pads 48 of the die 14A. Indentation contact members 46A for the interconnect 10A are configured to retain and make electrical contact with the metal bumps 60. In the alternate embodiment interconnect 10A, the base 16B includes an opening 41B having a countersunk edge to facilitate placing the interconnect 10A into the base 16B.

Referring to FIG. 7, further details of the construction of the contact members 46 for the interconnect 10 are shown. In the embodiment of FIG. 7, the contact members 46 project from the active surface 11 (FIG. 5) of the interconnect 10. The contact members 46 can be formed in patterns that correspond to the locations of the bond pads 48 (or other contact locations) on the die 14. In addition, the contact members 46 can include penetrating projections 52 configured to penetrate the bond pads 48 on the die 14 to a self limiting penetration depth. In the illustrative embodiment, the penetrating projections 52 are elongated blades with generally flat tips formed in parallel spaced arrays. The penetrating projection 52 can also be formed as sharpened, pointed or conical members. As will be further explained, with the substrate 44 formed of silicon or a silicon containing outer layer, the penetrating projections 52 and contact members 46 can be formed by etching the substrate 44. With the substrate 44 formed of a photosensitive glass, the penetrating projections 52 and contact members 46 can be formed by photo machining processes.

The interconnect 10 also includes a substrate insulating layer 54 for electrically insulating the bulk of the substrate 44 from the conductors 50. With the substrate 44 formed of silicon, one method for forming the substrate insulating layer 54 is by oxidation of the substrate 44 to form $SiO_2$. Another method is to deposit an insulating material, such as $Si_3N_4$, or polyimide, onto the substrate 44 to a desired thickness (e.g., 500Å to 2 μm).

Still referring to FIG. 7, in addition to the substrate insulating layer 54, the contact members 46 include a conductive layer 56. The conductive layer 56 for each contact member 46 can be formed in electrical communication with the multi level conductors 50. As also shown in FIG. 7, the multi level conductors 50 can be formed to surround or encompass the conductive layer 56 to provide a low resistance electrical connection with the conductive layer 56. The conductive layer 56 for the contact members 46 can be formed of a highly conductive metal such as aluminum. Alternately the conductive layer 56 can be formed by depositing a metal layer and a silicon containing layer and then reacting these layers to form a metal silicide ($TiSi_2$, $WSi_2$, $TaSi_2$, $MoSi_2$, $PtSi_2$). Suitable processes for forming the contact members 46, substantially as shown in FIG. 7, are disclosed in U.S. Pat. Nos. 5,326,428; 5,419,807 and 5,483,741 which are incorporated herein by reference.

FIG. 7A illustrates in greater detail the alternate embodiment interconnect 10A for testing a bumped die 14A. In FIG. 7A, an indentation contact member 46A for the interconnect 10A includes an indentation 62 for retaining the metal bump 60. In addition, a conductive layer 56A is formed in the indentation 62 in electrical communication with a corresponding multi level conductor 50AA (FIG. 8A) equivalent to conductor 50 in FIGS. 5 and 7. The conductive layer 56A is configured to establish electrical communication with the metal bump 60. The conductive layer 56A can be separated from the substrate 44A by a substrate insulating layer 54A formed as previously described.

FIG. 7B illustrates another alternate embodiment interconnect 10B for testing bumped dice 14A. In FIG. 7B, a contact member 46B includes penetrating projections 52A configured to penetrate the metal bump 60 to a self limiting penetration depth. A conductive layer 56B equivalent to conductors 50 (FIG. 5) is formed over the penetrating projections 52A in electrical communication with multi level conductors. The conductive layer 56B is configured to penetrate the metal bump 60 on the bumped die 14A to a limited penetration depth. The conductive layer 56B is separated from the substrate 44B by an insulating layer 54B formed as previously described. U.S. Pat. No. 5,592,730, incorporated herein by reference, discloses interconnects with contact members for testing bumped semiconductor dice.

FIG. 7C illustrates another alternate embodiment wherein indentation contact member 46K includes at least one penetrating projection 52K formed within the contact member 46K.

Referring to FIG. 8, an exemplary multi layered construction for the interconnect 10 is shown. In FIG. 8, the contact members 46 are shown without penetrating projections 52 for simplicity. The interconnect 10 can include a first multi level conductor 50A and a second multi level conductor 50B. The first multi level conductor 50A is separated from the substrate 44 by a first electrically insulating layer 58A and is embedded in a second electrically insulating layer 58B. The second multi level conductor 50B is embedded in a third electrically insulating layer 58C. The electrically insulating layers 58A, 58B, 58C separate and electrically insulate the multi level conductors 50A and 50B in both horizontal and vertical planes.

The multi level construction permits the multi level conductors 50A, 50B to be formed with a higher density than equivalent conductors formed in the same plane. This higher density of the conductors 50A, 50B permits a higher density for the contact members 46. Accordingly, the contact members 46 can be formed in dense arrays to accommodate testing of dice 14 having bond pads 48 (or test pads) arranged in dense arrays. Such a multi level construction can be used to provide 1000 or more separate input/output paths. A representative thickness for the multi level conductors 50A, 50B can be from 500Å to 15,000Å. In addition, such a multi level construction can be used to tailor the electrical characteristics of the interconnect 10 including the conductivity, resistivity, and impedance thereof.

As will be further explained, the electrically insulating layers 58A–58C can be formed of a deposited material such as an oxide, nitride or polyimide. A representative thickness for the insulating layers 58A–58C can be from 500Å to 2 μm.

FIG. 8A illustrates an exemplary multi layered construction for the interconnect 10A (FIG. 7A) for bumped dice 14A (FIG. 7A). The interconnect 10A can include a first multi level conductor 50AA, a second multi level conductor 50AB and a third multi level conductor 50AC. The first multi level conductor 50AA is in electrical communication with a corresponding indentation contact member 46A. The second multi level conductor 50AB is in electrical communication with another indentation contact member 46A. A vertical runner 80 such as a metal filled via electrically connects the multi level conductor 50AB to its corresponding indentation contact member 46A. The third multi level conductor 50AC is in electrical communication with an indentation contact member that is not shown. Stacks of insulating layers 58AA, 58AB, 58AC, 58AD electrically insulate the multi level conductors 50AA, 50AB, 50AC from one another and from the substrate 44A.

In FIG. 8A, the substrate 44CR can comprise a ceramic material that is laser machined, etched or mechanically punched to form concave depressions for the indentation contact members 46A. The concave depressions can have a size that corresponds to the size of the metal bumps 60 (FIG. 7A). Conventionally formed solder bumps on a bumped dice will have a diameter of from 5 mils to 30 mils. Accordingly, the indentation contact members 46A can be formed with a diameter of from 1 to 10 mils.

In FIG. 8A, the multi level conductors 50AA, 50AB, 50AC can be formed of a highly conductive metal such as aluminum using a suitable metallization process. A representative thickness for the multi level conductors 50AA, 50AB, 50AC can be from 500Å to 3000Å. The insulating layers 58AA, 58AB, 58AC, 58AD can be formed of an electrically insulating material such as polyimide, using a suitable deposition process (e.g., spin-on). Depending on the material and deposition process, a thickness of each insulating layer 58AA, 58AB, 58AC, 58AD can be from 500Å to 2 µm or more.

Figure 9A:
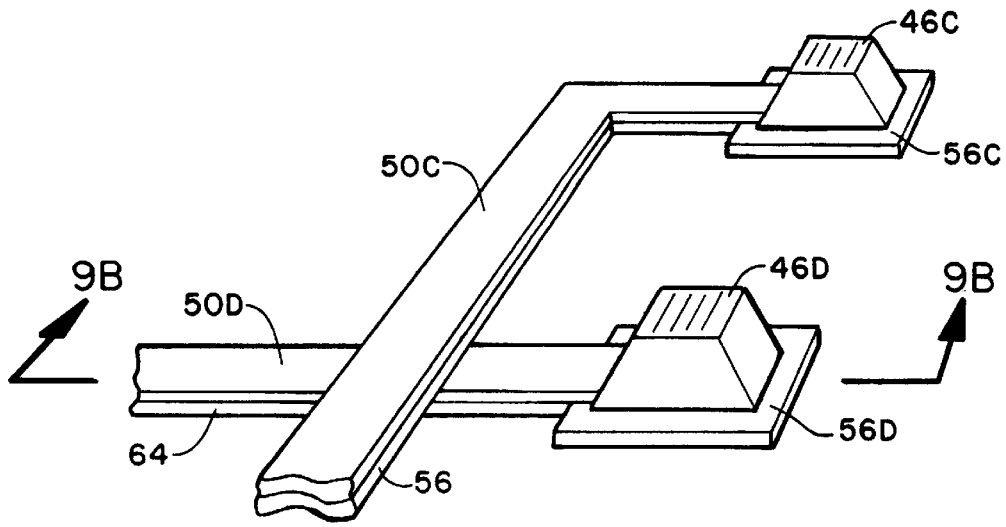
FIG. 9A is a schematic perspective view of contact members on the interconnect and multi level conductors to the contact members.
Figure 9B:
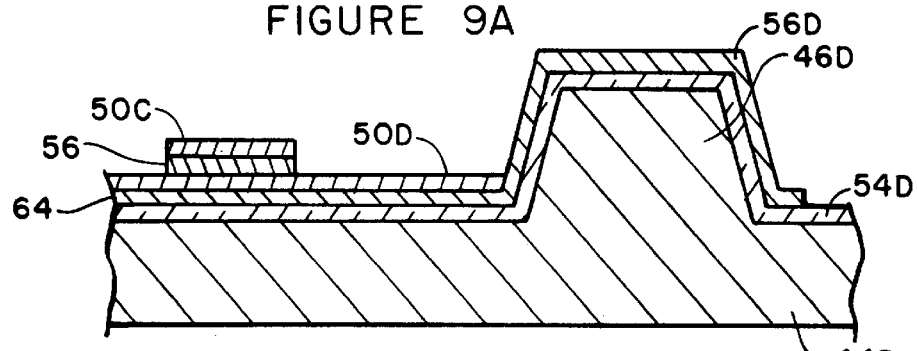
FIG. 9B is a schematic cross sectional view taken along section line 9B—9B of FIG. 9A.

Referring to FIGS. 9A and 9B, a representative layout of multi level conductors 50C and 50D for adjacent contact members 46C and 46D is shown. Contact members 46C and 46D include conductive layers 56C, 56D as previously described and a substrate insulating layer 54D also as previously described. The conductive layer 56C for contact member 46C is in electrical communication with conductor 50C. The conductive layer 56D for contact member 46D is in electrical communication with conductor 50D. If desired, the conductive layers 56C and 56D can be formed by the same layer of material patterned as required to cover the contact members 46C, 46D.

As shown in FIG. 9B, conductor 50C is located subjacent to conductor 50D. In addition, an insulating layer 64 separates conductor 50C from conductor 50D. An exemplary process sequence for forming the layout of FIGS. 9 and 9A is as follows:

1. Initially the substrate 44D can be formed of an etchable material such as silicon, germanium, silicon-on-glass or silicon-on-sapphire. The substrate 44D can be formed with a required peripheral size and outline. For example, the substrate 44D can have a generally rectangular peripheral outline as in FIG. 5, with a size approximately equal to or slightly larger than the die 14.

2. Next, penetrating projections 52D can be etched using a suitable mask formed on the substrate 44D. For example, a layer of $Si_3N_4$ can be CVD deposited to a thickness of about 500Å to 3000Å then patterned using photolithography and used as a mask for etching the substrate 44D. The etch process can be anisotropic (e.g., $KOH-H_2O$ etchant) or isotropic (e.g., $HF$, $HNO_3$, $H_2O$ etchant). These types of etch processes for silicon are sometimes referred to a bulk micro machining. A representative height of the penetrating projections 52D can be from 2Å to 1.5 µm. An example spacing between projections 52D can be from 3 to 10 µm. An example length of the projections 52D can be from 3 to 10 µm.

3. Next, the mask is removed and the contact members 46C, 46D can be etched. Etching can be using a bulk micro machining process as described in step 2. A representative height of the contact member 46D can be from 50–100 µm. A representative width on each side can be from 40–80 µm. A location for the contact member 46D can conform to the location of the bond pad 48 (FIG. 7) on the die 14.

4. Next, the substrate insulating layer 54D can be formed using a suitable process, such as by oxidation of the substrate 44D to form $SiO_2$. The substrate insulating layer 54D can also be a deposited material such as $Si_3N_4$ or polyimide. A representative thickness for the insulating layer 54D can be from 500Å to 2 µm.

5. Next, the conductive layers 56C and 56D can be formed on the contact members 46C, 46D by depositing (e.g., CVD), patterning and then etching a metal layer (e.g., aluminum). The conductive layers 56C, 56D can also be a metal silicide formed by depositing a metal layer and a silicon containing layer (e.g., polysilicon) and then reacting these layers by heating to a temperature of about 650° C. The unreacted portion of the silicon containing layer can then be removed (e.g., $HF:HNO_3:H_2O$ for polysilicon). A representative thickness for the conductive layer 56C, 56D can be from 500Å to 3000Å.

6. Next, conductor 50C can be formed by blanket depositing a conductive metal layer (e.g., aluminum) then photopatterning and etching the metal layer. The conductor 50C can be formed in electrical communication with conductive layer 56C for contact member 46C. The conductor 50C can include a connection pad equivalent to connection pad 42 (FIG. 5) located along the periphery of interconnect 10 in a dense array. Such a connection pad can be formed of a same metal as the conductor 50C or can be one or more different layers having a metallurgy suitable for soldering (e.g., aluminum/solder stack).

7. Next, insulating layer 64 can be formed at least over the conductor 50C and preferably over the entire substrate 44D. The insulating layer 64 can be a deposited material such as a chemical vapor deposited oxide (e.g., $SiO_2$) or nitride (e.g., $Si_3N_4$). A representative thickness for a deposited insulating layer 64 can be from 500 to 3000Å. The insulating layer 64 can also be a polymer layer such as polyimide formed using a suitable deposition process such as a spin on process.

8. Next, conductor 50D can be formed by blanket depositing a conductive metal layer (e.g., aluminum) on the insulating layer 64 then photopatterning and etching the metal layer. The conductor 50D can be formed in electrical communication with conductive layer 56D for contact member 46D. In addition, the conductor 50D can include a connection pad formed as previously described.

In the completed layout of FIGS. 9A and 9B, the contact members 46C, 46D can be formed in a dense array because a dense layout can be provided by the multi level conductors 50C, 50D. In addition, cross talk between the conductors 50C and 50D can be reduced by the location of the insulating layer 64. Still further, insulating layer 64 and the substrate insulating layer 54D help to eliminate capacitive coupling with the substrate 44D.

Instead of being formed of silicon, a substrate can also be formed of a photosensitive glass, or glass-ceramic material such as "FOTOFORM" manufactured by Corning. In this case, a photo machining process can be used to form the contact members and penetrating projections.

Figure 10:
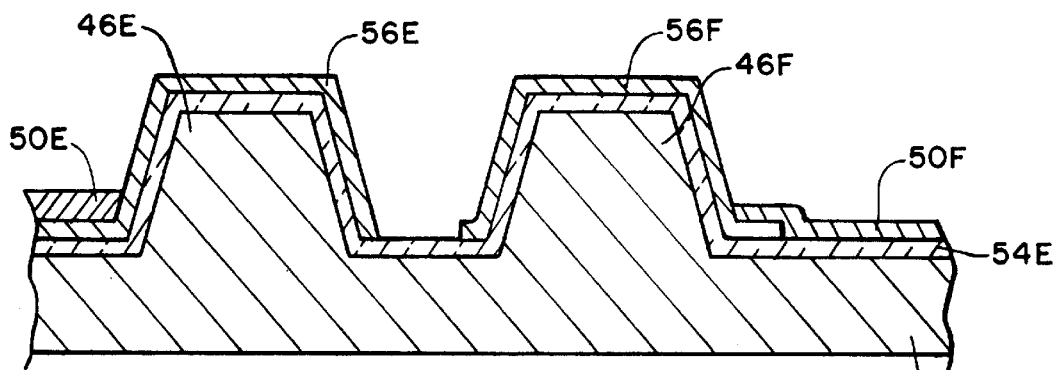
FIG. 10 is a schematic cross sectional view illustrating an alternate embodiment layout of multi level conductors for the contact members.

Referring to FIG. 10, another exemplary layout includes a first contact member 46E and a second contact member 46F formed on a substrate 44E with an insulating layer 54E as previously described. Contact member 46E includes a conductive layer 56E formed in electrical communication with conductor 50E. Contact member 46F includes a conductive layer 56F formed in electrical communication with conductor 50F. The conductors 50E and 50F can be formed on different levels while conductive layers 56E and 56F can be formed of the same layer of material (e.g., $TiSi_2$) patterned as required.

Figure 11:
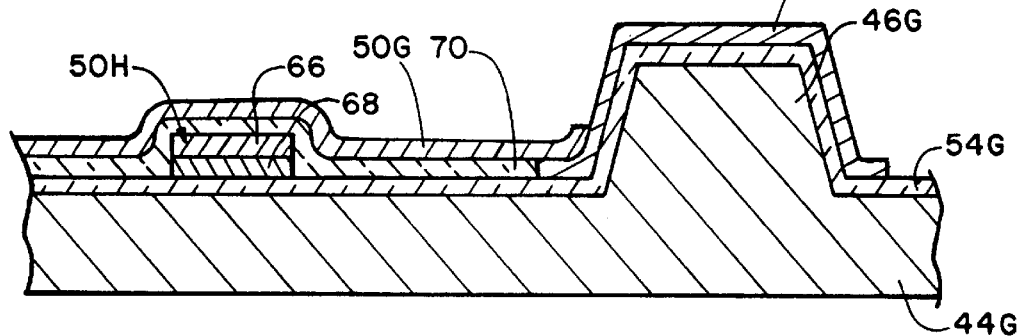
FIG. 11 is a schematic cross sectional view illustrating another alternate embodiment layout of multi level conductors.

Referring to FIG. 11, another exemplary layout includes a contact member 46G formed on a substrate 44G with an insulating layer 54G. The contact member 46G includes a conductive layer 56G (e.g., $TiSi_2$) formed as previously described in electrical communication with a conductor 50G. A conductor 50H is located subjacent to conductor 50G and comprises a bi-metal stack including a first layer 66 and a second layer 68. The first layer 66 can be a metal formed as previously described. The second layer 68 can be formed of a same conductive material (e.g., $TiSi_2$) as conductive layer 56G. In addition, an insulating layer 70 separates conductor 50G from conductor 50H.

Figure 12:
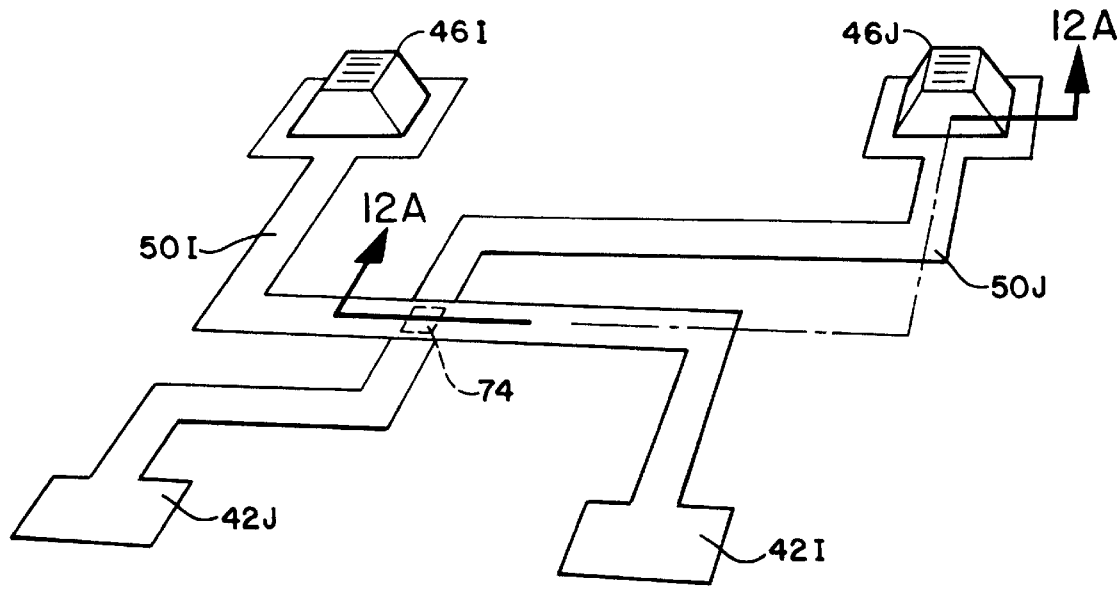
FIG. 12 is a schematic perspective view illustrating another layout of multi level conductors wherein the conductors are electrically connected to one another.
Figure 12A:
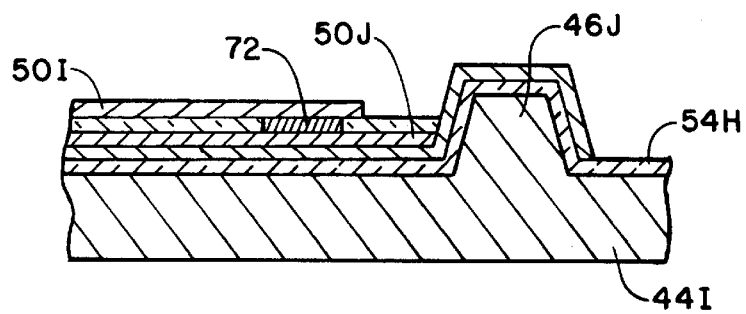
FIG. 12A is a cross sectional view taken along section line 12A—12A of FIG. 12 illustrating the electrical connection between the conductors.

Referring to FIGS. 12 and 12A, another exemplary layout is shown. In FIG. 12 contact members 46I and 46J are formed on a substrate 44I having an insulating layer 54H as previously described. Contact member 46I is in electrical communication with a conductor 50I having a connection pad 42I (FIG. 12). Contact member 46J is in electrical communication with a conductor 50J having a connection pad 42J (FIG. 12). Conductors 50I and 50J are formed on different levels with respect to the active surface of the substrate 44I and are separated by an insulating layer 72 (FIG. 12A). However, in this case it is desirable to electrically connect the contact members 46I and 46J. Accordingly, as shown in FIG. 12A at the crossing point of the conductors 50I and 50J, a via is formed in the insulating layer 72 and filled with a conductive plug 74. This approach is useful for testing dice such as microprocessors having multiple outputs or inputs electrically connected to one another.

Figure 13:
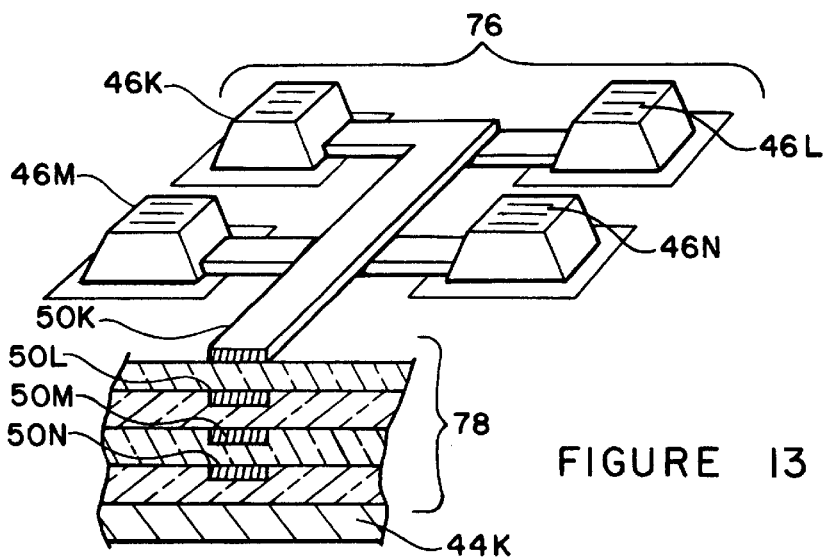
FIG. 13 is a schematic view partially cut away illustrating multi level conductors on an interconnect constructed in accordance with the invention.

Referring to FIG. 13, another exemplary layout includes a dense array 76 of contact members 46K–46N formed as previously described on a substrate 44K. Each contact member 46K–46N includes an associated conductor 50K–50N formed on the substrate and separated by a stack 78 of insulating layers.

An exemplary test sequence for testing semiconductor dice using an interconnect constructed in accordance with the invention can include the following steps.

1. Initially, a temporary package for retaining a bare semiconductor die can be provided as previously described.
2. In addition, an interconnect comprising contact members and multi level conductors can be provided as previously described.
3. The interconnect can be mounted within the temporary package with the conductors on the interconnect in electrical communication with terminal contacts on the temporary package. One method for establishing low resistance electrical paths between the conductors and terminal contacts is with microbump tape as previously described.
4. For assembling the die within the temporary package, optical alignment techniques can be used to align the contact members on the interconnect with the contact locations (e.g., bond pads) on the die. U.S. Pat. No. 5,519,332 previously incorporated by reference, describes a suitable method of optical alignment.
5. With the die held within the temporary package, the package can be placed in electrical communication with a testing apparatus (e.g., burn-in oven) having test circuitry.
6. Test signals can be applied through the terminal contacts on the temporary package, through the conductors on the interconnect, through the contact members on the interconnect and to the die.
7. Following testing the temporary package and die can be disassembled with the die certified as a known good die.

The invention provides an improved interconnect formed with multi level conductors. The multi level conductors allow high speed testing with less cross talk. In addition, a low resistance electrical connection can be made to the conductors using bonded microbump tape.

While the invention has been described with reference to certain preferred embodiments, as will be apparent to those skilled in the art, certain changes and modifications can be made without departing from the scope of the invention as defined by the following claims.

What is claimed is:

1. A temporary package for testing a semiconductor die comprising:
   a base adapted to retain the die, the base comprising a plurality of terminal contacts and an opening formed therein;
   an interconnect placed through the opening and bonded to the base, the interconnect comprising a plurality of first contacts configured to establish temporary electrical communication with a plurality of second contacts on the die, and a plurality of conductors in electrical communication with the first contacts and with the terminal contacts.

2. The package as claimed in claim 1 wherein the die comprises an unpackaged die.

3. The package as claimed in claim 1 wherein the die comprises a chip scale package.

4. The package as claimed in claim 1 wherein the interconnect is bonded to the base by TAB bonding or wire bonding.

5. A temporary package for testing a semiconductor die comprising:
   a base adapted to retain the die, the base comprising an opening and a plurality of terminal contacts and conductive traces in electrical communication with the terminal contacts;
   an interconnect placed through the opening and bonded to the base, the interconnect comprising a plurality of first contacts configured to establish temporary electrical communication with a plurality of second contacts on the die; and
   a tape comprising metal bumps bonded to the conductors on the interconnect and to the conductive traces on the base to establish electrical communication therebetween.

6. The package as claimed in claim 5 wherein the second contacts comprise second metal bumps and the first contacts comprise indentations sized to retain the second metal bumps.

7. The package as claimed in claim 5 wherein the second contacts comprise second metal bumps and the first contacts comprise indentations with projections configured to penetrate the second metal bumps.

8. A temporary package for testing a bare semiconductor die or a chip scale package comprising:
   a base configured to retain the die or the chip scale package, the base comprising an opening, a plurality of terminal contacts connectable to test circuitry, and a plurality of conductive traces in electrical communication with the terminal contacts;
   an interconnect placed through the opening and bonded to the base, the interconnect comprising a plurality of first contacts comprising indentations configured to retain and establish temporary electrical communication with a plurality of metal bumps on the die or on the chip scale package, the indentations comprising conductive layers in electrical communication with a plurality of conductors on the interconnect; and
   a plurality of bonded connections between the conductive traces on the base and the conductors on the interconnect.

9. The package as claimed in claim 8 wherein the bonded connections comprise TAB tape.

10. The package as claimed in claim 8 wherein the indentations comprise penetrating projections configured to penetrate the metal bumps.

11. The package as claimed in claim 8 wherein the conductors comprise a plurality of connection pads for the bonded connections.

12. A temporary package for testing a chip scale package comprising:
 a package base configured to retain the chip scale package, the base comprising an opening;
 an interconnect placed through the opening and bonded to the base;
 a first contact and a second contact on the interconnect, each contact comprising an indentation with a conductive layer thereon configured to retain and establish electrical communication with a metal bump on the chip scale package;
 a first conductor on the interconnect located in a first plane in electrical communication with the first contact; and
 a second conductor on the interconnect located in a second plane in electrical communication with the second contact.

13. The package as claimed in claim 12 wherein the conductive layer comprises a material selected from the group consisting of metal and metal silicide.

14. The package as claimed in claim 12 wherein the indentation includes a projection configured to penetrate into the metal bump.

15. The package as claimed in claim 12 wherein an electrical path between the package base and the first and second conductors comprises metal bumps formed on microbump tape.

16. The interconnect as claimed in claim 12 wherein the first conductor and the second conductor include metal connection pads arranged in an array along a periphery of the interconnect.

17. A system for testing a semiconductor die or a chip scale package comprising:
 a temporary package for retaining the die or the chip scale package, the temporary package comprising a base including an opening therein and a plurality of terminal contacts in electrical communication with a plurality of conductive traces;
 an interconnect placed through the opening and bonded to the base, the interconnect comprising a plurality of first contacts for establishing temporary electrical communication with a plurality of second contacts on the die or the chip scale package, and a plurality of conductors in electrical communication with the first contacts; and
 a tape with metal bumps thereon, the metal bumps bonded to the conductors and to the conductive traces on the base.

18. The system as claimed in claim 17 further comprising a force applying mechanism for biasing the die or the chip scale package against the interconnect.

19. A method for testing a semiconductor die comprising:
 providing a temporary package for the die comprising an opening, a plurality of terminal contacts, and a plurality of conductive traces in electrical communication with the terminal contacts;
 providing an interconnect comprising a plurality of first contacts configured to make electrical contact with a plurality of second contacts on the die, the first contacts in electrical communication with conductors formed on the interconnect;
 providing a tape with a plurality of metal bumps;
 placing the interconnect through the opening;
 bonding the metal bumps on the tape to the conductive traces and to the conductors to establish electrical communication therebetween; and
 applying test signals through the terminal contacts, conductive traces, conductors and first contacts to the die.

20. The method as claimed in claim 19 wherein the second contacts comprise second metal bumps and the first contacts comprise indentations covered with conductive layers.

21. The method as claimed in claim 19 wherein the tape comprises TAB tape.

22. The method as claimed in claim 19 wherein the first contacts comprise penetrating projections for penetrating the second contacts.

23. The method as claimed in claim 19 wherein the second contacts comprise second metal bumps and the first contacts comprise indentations configured to retain the second metal bumps and penetrating projections configured to penetrate the second metal bumps.

24. A method for testing a chip scale package comprising:
 providing a temporary package for packaging the chip scale package, the temporary package comprising an opening and a plurality of terminal contacts in electrical communication with a plurality of conductive traces;
 providing an interconnect comprising a plurality of first contacts in electrical communication with a plurality of conductors, the first contacts comprising indentations with conductive layers thereon configured to retain and electrically engage bumped contacts on the chip scale package;
 placing the interconnect through the opening and bonding the conductors to the conductive traces to establish electrical communication therebetween; and
 assembling the chip scale package in the temporary package with the first contacts in electrical communication with the bumped contacts.

25. The method as claimed in claim 24 wherein bonding the conductors to the conductive traces comprises TAB bonding.

26. A method for fabricating a temporary package for testing a semiconductor die, comprising:
 providing a base comprising an opening, a plurality of terminal contacts and a plurality of conductive traces in electrical communication with the terminal contacts;
 providing an interconnect comprising a plurality of first contacts in electrical communication with a plurality of conductors, the first contacts configured to electrically engage second contacts on the die;
 placing the interconnect through the opening; and
 bonding the conductive traces to the conductors.

27. The method as claimed in claim 26 wherein bonding comprises TAB bonding.

28. The method as claimed in claim 26 wherein the first contacts comprise indentations and the second contacts comprise metal bumps.

29. The method as claimed in claim 26 wherein the die comprises a chip scale package.

* * * * *